(12) United States Patent
Daubenspeck et al.

(10) Patent No.: US 7,521,287 B2
(45) Date of Patent: Apr. 21, 2009

(54) WIRE AND SOLDER BOND FORMING METHODS

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/561,434

(22) Filed: Nov. 20, 2006

(65) Prior Publication Data

US 2008/0119035 A1    May 22, 2008

(51) Int. Cl.
*H01L 21/60* (2006.01)

(52) U.S. Cl. .................. 438/108; 438/613; 438/617; 257/E21.508; 257/E21.509

(58) Field of Classification Search .................. 438/108, 438/613, 617; 257/E21.509, E21.508
See application file for complete search history.

(56) References Cited

U.S. PATENT DOCUMENTS

| | | | |
|---|---|---|---|
| 5,445,311 A * | 8/1995 | Trask et al. | 228/175 |
| 5,844,317 A | 12/1998 | Bertolet et al. | |
| 5,963,785 A * | 10/1999 | Katoh et al. | 438/33 |
| 6,204,074 B1 | 3/2001 | Bertolet et al. | |
| 6,326,676 B1 * | 12/2001 | Ohde et al. | 257/620 |
| 6,388,199 B1 * | 5/2002 | Jiang et al. | 174/255 |
| 6,534,863 B2 | 3/2003 | Walker et al. | |
| 6,577,008 B2 * | 6/2003 | Lam et al. | 257/750 |
| 6,620,720 B1 * | 9/2003 | Moyer et al. | 438/612 |
| 6,744,140 B1 * | 6/2004 | Ueda | 257/777 |
| 6,762,117 B2 | 7/2004 | Lam et al. | |
| 6,762,122 B2 * | 7/2004 | Mis et al. | 438/683 |
| 7,032,806 B2 * | 4/2006 | Rinne | 228/180.22 |
| 7,037,754 B2 * | 5/2006 | Ueda | 438/108 |
| 2002/0003305 A1 * | 1/2002 | Umakoshi et al. | 257/760 |
| 2002/0043397 A1 * | 4/2002 | Jiang et al. | 174/255 |
| 2002/0100967 A1 * | 8/2002 | Gaku et al. | 257/707 |
| 2002/0112884 A1 * | 8/2002 | Tanaka | 174/262 |
| 2002/0195696 A1 * | 12/2002 | Yoneda | 257/678 |
| 2003/0057559 A1 * | 3/2003 | Mis et al. | 257/762 |
| 2004/0173917 A1 * | 9/2004 | Ueda | 257/787 |

(Continued)

OTHER PUBLICATIONS

PCT/EP2007/061766 International Search Report to be included with the Information Disclosure Statement filed on May 27, 2008, mailed Feb. 27, 2008, 11 pages.

*Primary Examiner*—George Fourson
(74) *Attorney, Agent, or Firm*—Anthony J. Canale; Hoffman Warnick LLC

(57) ABSTRACT

Methods of forming wire and solder bond structures are disclosed. In one embodiment, a method includes providing a structure including a wire bond metal region for the wire bond and a solder bond metal region for the solder bond; forming a protective layer over the wire bond metal region only; forming a silicon nitride layer over a silicon oxide layer over the wire bond metal region and the solder bond metal region; forming the solder bond to the solder bond metal region while maintaining the wire bond metal region covered; exposing the wire bond metal region including removing the protective layer; and forming the wire bond to the wire bond metal region. Wire bond and solder bond structures can be made accessible on a single multi-part wafer (MPW) wafer or on a single chip, if necessary.

20 Claims, 9 Drawing Sheets

U.S. PATENT DOCUMENTS

| | | | |
|---|---|---|---|
| 2005/0017355 A1* | 1/2005 | Chou et al. | 257/738 |
| 2005/0064625 A1* | 3/2005 | Huang | 438/106 |
| 2007/0231936 A1* | 10/2007 | Kanda et al. | 438/16 |
| 2008/0080112 A1* | 4/2008 | Lin et al. | 361/56 |
| 2008/0119035 A1* | 5/2008 | Daubenspeck et al. | 438/612 |
| 2008/0119036 A1* | 5/2008 | Daubenspeck et al. | 438/612 |

* cited by examiner

WIRE AND SOLDER BOND FORMING METHODS

BACKGROUND OF THE INVENTION

1. Technical Field

The invention relates generally to semiconductor device packaging, and more particularly, to methods of forming wire and solder bonds.

2. Background Art

Simultaneous use of wire bond and solder bond structures in the semiconductor industry is increasing. In one example, wire and solder bonds are advantageous for use in multi-part wafers (MPWs), which are currently increasing in popularity. Some of these MPWs include chips that require both wire bonds and solder bonds designed into a common reticle, i.e., they are fabricated together. In a solder bond, a solder joint flip chip, connection to a substrate is made where the surface tension forces of the molten solder controls the height of the joint and supports the weight of the chip. The solder bond is oftentimes referred to as a controlled collapse chip connection (C4). In a wire bond, a wire is joined to an opening in the chip. Where both types of bonds are used, the fabrication process must be capable of opening both wire bond and solder bond final via structures in parallel.

The ability to create both wire bond and solder bond structures within a single processed part extends beyond the use with MPWs. There are certain chip products (or test sites) that also require both solder and wire bond access points within the boundary of the individual chip itself. For example, in the case of parts being built for stacked packages, the chips must make solder bond connections to other chips within the stack and a wire bond connection out to the package substrate or laminate. Simultaneous use of wire and solder bonds may also be advantageous for a technology qualification test-site. For example, it may be preferred to have both types of connections for a single common test site in order to enable qualification of front-end-of-line (FEOL) and back-end-of-line (BEOL) structures in both wire and solder bond packaging environments, but without having to design and build two different test-sites.

Generating wire and solder bonds together presents a number of challenges. For example, some of the processes used for each type of bond are detrimental to the other type of bond.

SUMMARY OF THE INVENTION

Methods of forming wire and solder bond structures are disclosed. In one embodiment, a method includes providing a structure including a wire bond metal region for the wire bond and a solder bond metal region for the solder bond; forming a protective layer over the wire bond metal region only; forming a silicon nitride layer over a silicon oxide layer over the wire bond metal region and the solder bond metal region; forming the solder bond to the solder bond metal region while maintaining the wire bond metal region covered; exposing the wire bond metal region including removing the protective layer; and forming the wire bond to the wire bond metal region. Wire bond and solder bond structures can be made accessible on a single multi-part wafer (MPW) wafer or on a single chip, if necessary.

A first aspect of the invention provides a method of forming wire and solder bond structures, the method comprising: providing a structure including a wire bond metal region for the wire bond and a solder bond metal region for the solder bond; forming a protective layer over the wire bond metal region only; forming a silicon nitride layer over a silicon oxide layer over the wire bond metal region and the solder bond metal region; forming the solder bond to the solder bond metal region while maintaining the wire bond metal region covered; exposing the wire bond metal region including removing the protective layer; and forming the wire bond to the wire bond metal region.

A second aspect of the invention provides a method of forming wire and solder bond structures, the method comprising: providing a structure including a wire bond metal region for the wire bond and a solder bond metal region for the solder bond; forming a silicon nitride layer over a silicon oxide layer over the wire bond metal region and the solder bond metal region; forming a protective layer over the wire bond metal region only by: forming an uncured polyimide layer over the silicon nitride layer over the solder bond metal region and the wire bond metal region, forming a first opening exposing the wire bond metal region through the polyimide layer, the silicon nitride layer and the silicon oxide layer, and a second opening exposing the solder bond metal region through the polyimide layer, the silicon nitride layer and the silicon oxide layer, and forming the protective layer by forming an uncured photosensitive polyimide (PSPI) layer over the exposed wire bond metal region only; forming the solder bond to the solder bond metal region while maintaining the wire bond metal region covered; removing the uncured PSPI layer to expose the wire bond metal region; and forming the wire bond to the wire bond metal region.

A third aspect of the invention provides a method of forming wire and solder bond structures, the method comprising: providing a structure including a wire bond metal region for the wire bond and a solder bond metal region for the solder bond; forming a protective layer over the wire bond metal region only by forming a barrier layer portion over the wire bond metal region only; forming a silicon nitride layer over a silicon oxide layer over the wire bond metal region and the solder bond metal region; forming an uncured polyimide layer over the silicon nitride layer over the solder bond metal region and the wire bond metal region; and forming a first opening exposing the barrier layer portion over the wire bond metal region through the polyimide layer, the silicon nitride layer and the silicon oxide layer, and a second opening exposing the solder bond metal region through the polyimide layer, the silicon nitride layer and the silicon oxide layer; forming the solder bond to the solder bond metal region while maintaining the wire bond metal region covered; exposing the wire bond metal region by removing the barrier layer portion; and forming the wire bond to the wire bond metal region.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
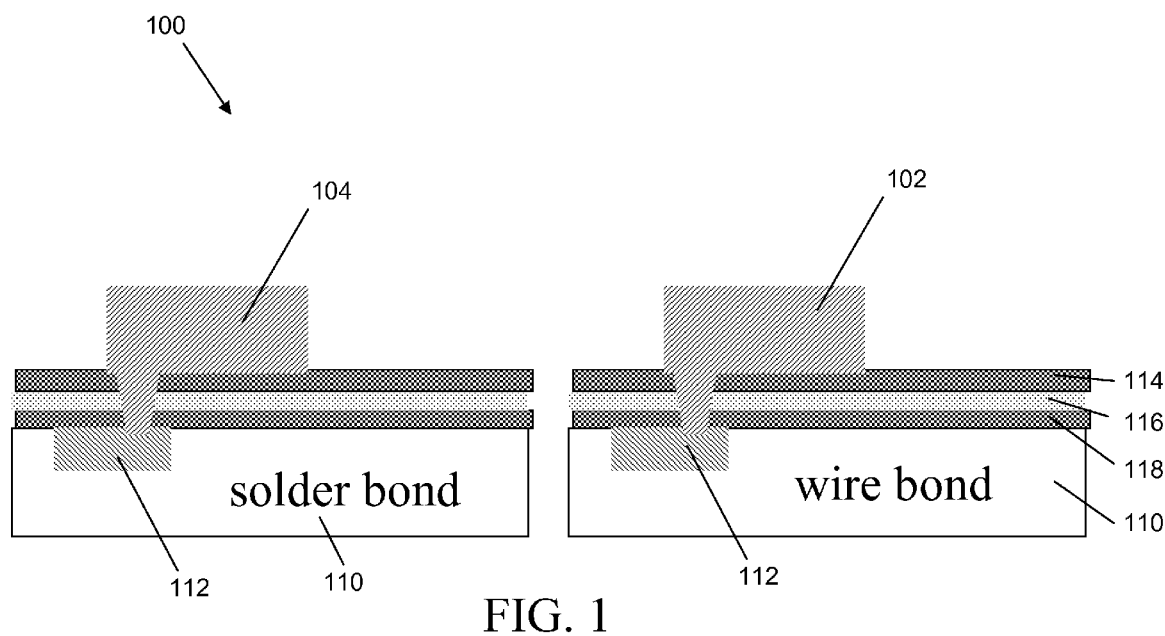
FIG. 1 shows a preliminary structure according to one embodiment of the invention.
Figure 5:
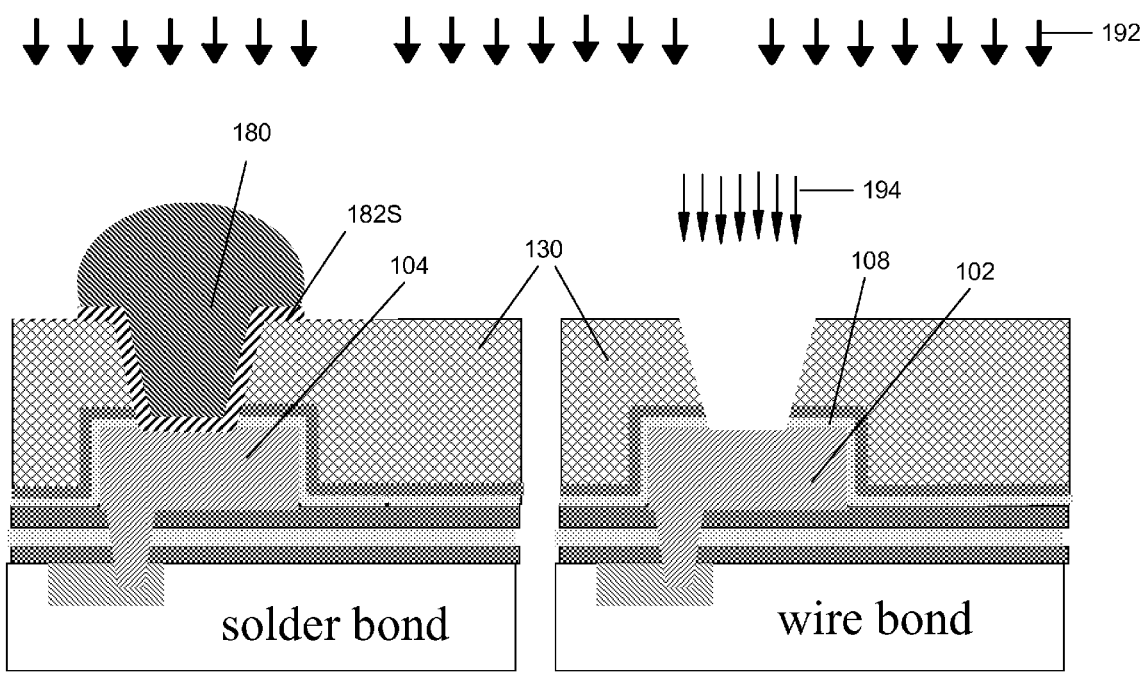
FIGS. 5-6 show one embodiment of a method of completing forming of a solder bond and a wire bond according to the invention.
Figure 6:
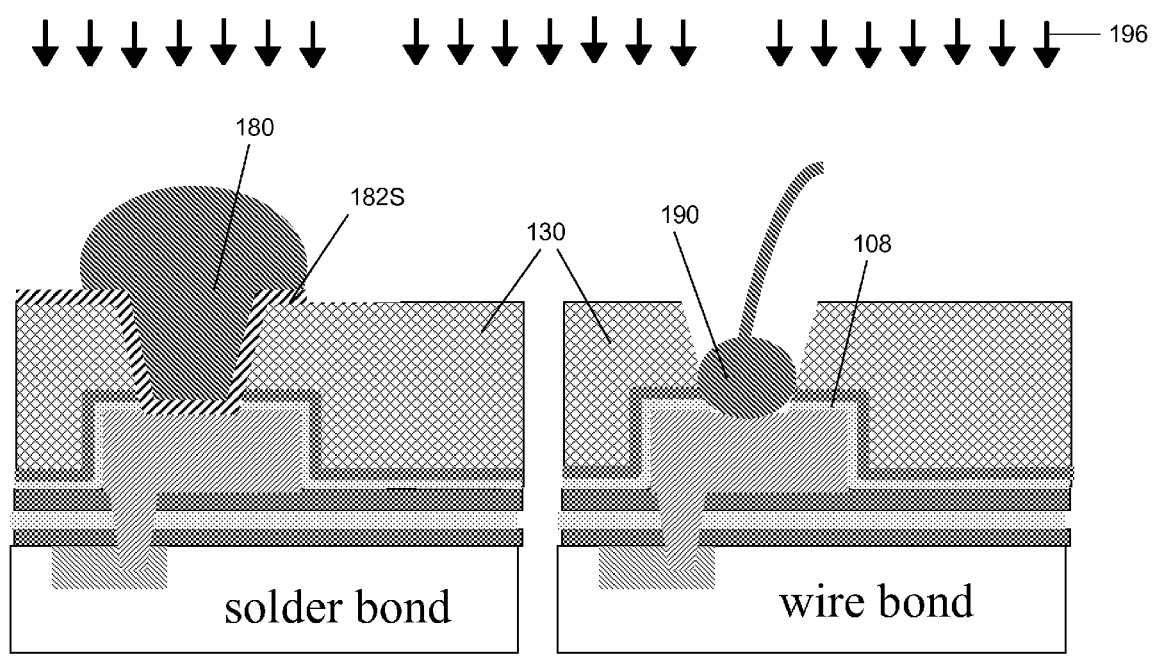

Turning to the drawings, various embodiments of a method of forming wire and solder bond structures are shown. FIG. 1 shows a preliminary structure 100 that is provided and includes a wire bond metal region 102 for a wire bond 190 (FIG. 6) and a solder bond metal region 104 for a solder bond 180 (FIGS. 5-6). Although shown separated, regions 102, 104 may be included in a single chip or be provided in a multi-part wafer. Hence, the separation indicated in the figures is meant to illustrate potential distance between regions 102, 104, not necessarily total separation. Other structure provided may include substrate 110 (e.g., a dielectric) including a wire 112 (e.g., copper or aluminum) and barrier layers 114, 116, 118 (e.g., silicon nitride, silicon oxide and silicon nitride, respectively). Each of metal region 102, 104 may include, for example, aluminum or copper.

Figure 2A:
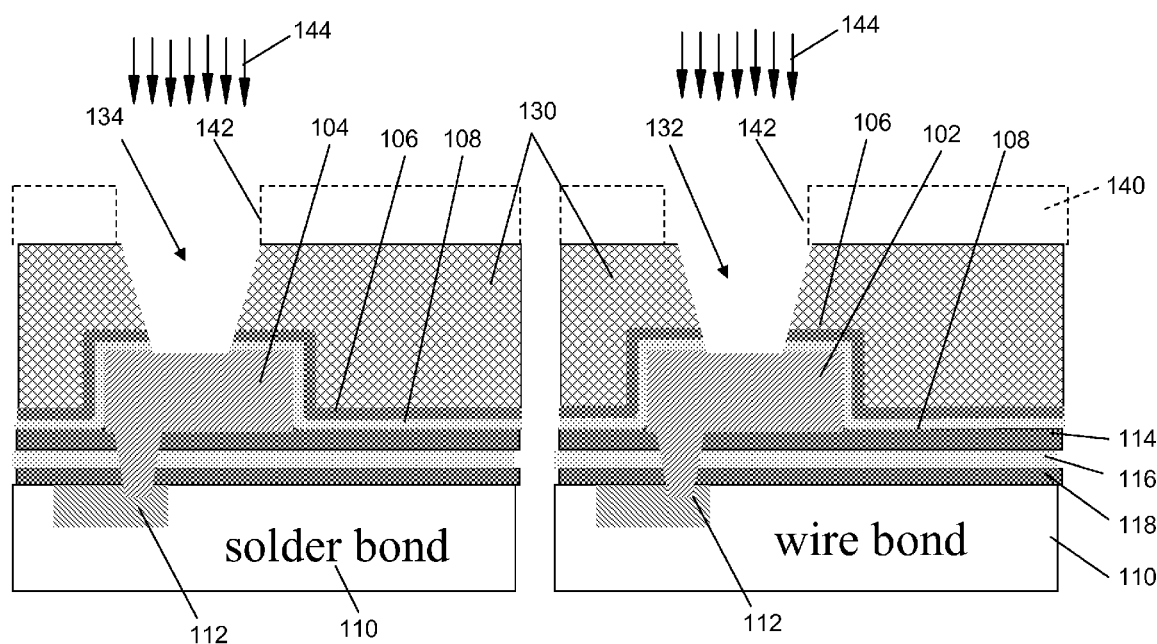
FIGS. 2A-B show a result of one step of a method according to one embodiment of the invention.
Figure 2B:
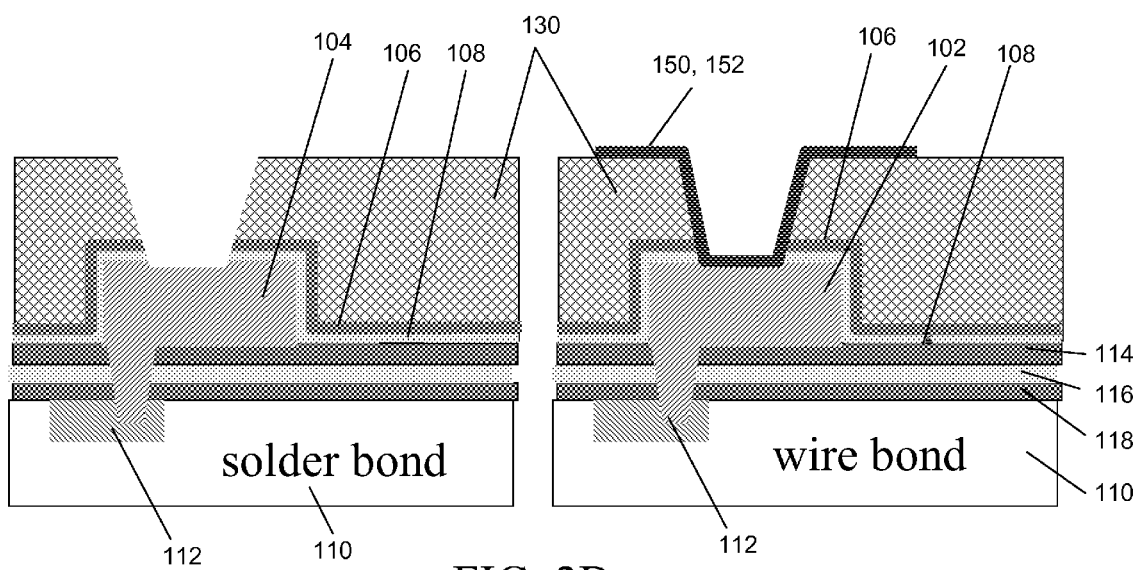
Figure 3A:
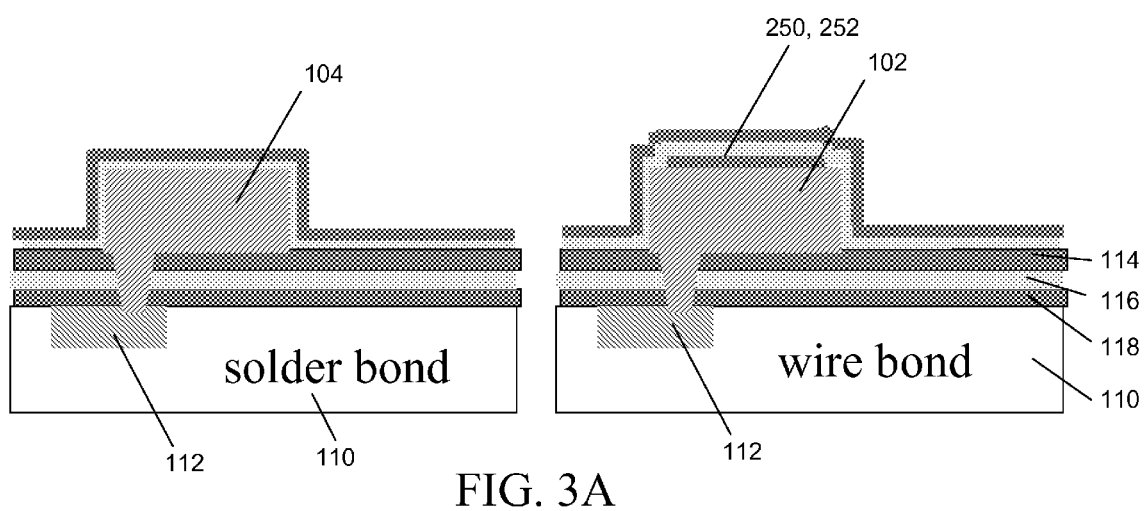
FIGS. 3A-B show one embodiment of forming the structure of FIGS. 2A-B, respectively.
Figure 3B:
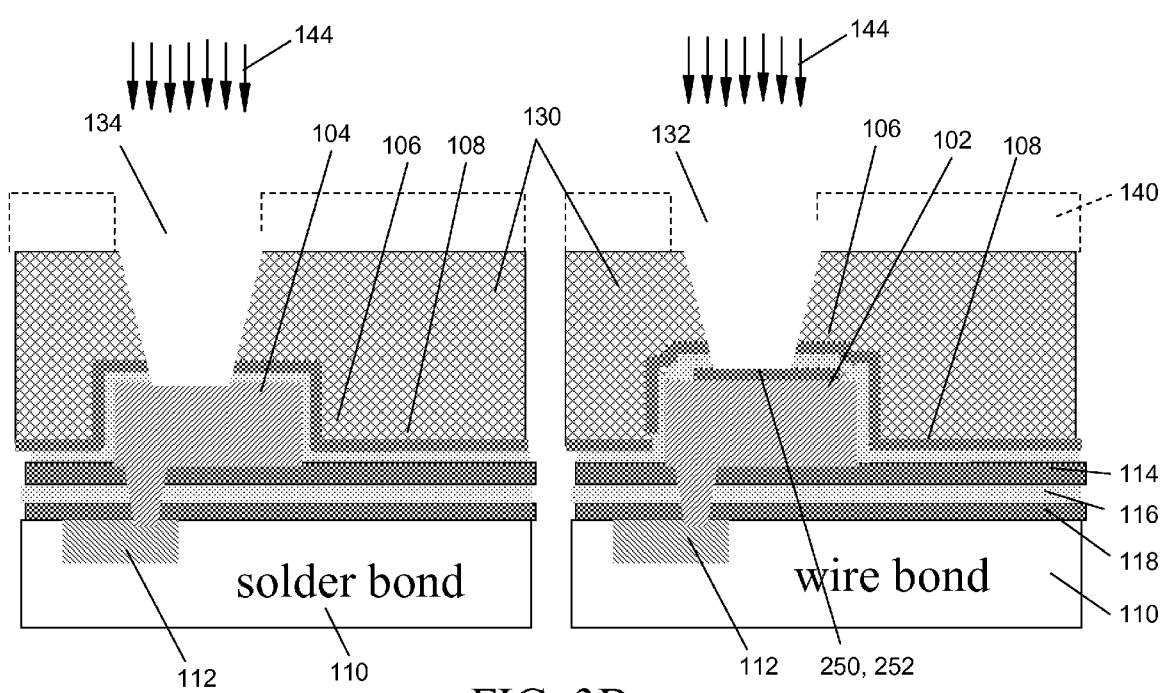

FIGS. 2A-B show a first embodiment and FIGS. 3A-B show a second embodiment of a method of forming a protective layer 150 (FIG. 2B), 250 (FIGS. 3A-B) over wire bond metal region 102 only. Turning to FIG. 2A, in this embodiment, starting with structure 100 of FIG. 1, a silicon nitride layer ($Si_3N_4$) 106 is formed over a silicon oxide layer ($SiO_2$) 108, which is formed over wire bond metal region 102 and solder bond metal region 104. Silicon nitride layer 106 may have a thickness of, for example, approximately 0.4 μm, and silicon oxide layer 108 may have a thickness of, for example, approximately 0.45 μm. However, the invention is not limited to those dimensions. An uncured polyimide or photosensitive polyimide (PSPI) layer 130 (hereinafter "polyimide layer 130") is then formed over silicon nitride layer 106 over solder bond metal region 102 and wire bond metal region 104. Layers 106, 108 and 130 may be formed using any now known or later developed techniques, e.g., depositing. Depositing, as used herein, may include any now known or later developed deposition technique. For example, depositing may include but is not limited to spin application of organic materials like photoresist and polyimide, in addition to inorganic films deposited by chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), sputtering deposition, ion beam deposition, electron beam deposition, laser assisted deposition, spin-on methods, physical vapor deposition (PVD), atomic layer deposition (ALD), depending on the materials deposited.

As also shown in FIG. 2A, a first opening 132 exposing wire bond metal region 102 through polyimide layer 130, silicon nitride layer 106 and silicon oxide layer 108, and a second opening 134 exposing solder bond metal region 104 through polyimide layer 130, silicon nitride layer 106 and silicon oxide layer 108 are substantially simultaneously formed. This step may occur in a number of ways, which are all considered within the scope of the invention. For example, a photoresist 140 (in phantom) may be formed over silicon nitride layer 106 over solder bond metal region 104 and wire bond metal region 102. Photoresists described herein may include any now known or later developed photoresist material, e.g., a positive resist such as HD4000 PSPI material, JSR M20 or Shipley UV2HS, except where expressly denoted. An intermediate opening 142 may be formed through photoresist 140 over wire bond metal region 102 and solder bond metal region 104 in any now known or later developed manner, e.g., patterning and etching. An etching 144 is performed such as a wet develop/etch to remove polyimide layer 130, followed by a reactive ion etch (RIE) to remove silicon nitride layer 106 and silicon oxide layer 108 over wire bond metal region 102 and solder bond metal region 104 using intermediate opening 142. Photoresist 140 is then removed using any now known or later developed stripping process. Each of the above-described protective layer forming stages occur prior to formation of a protective layer 150 (FIG. 2B).

As shown in FIG. 2B, protective layer 150 is formed over wire bond metal region 102 only. This stage may include forming protective layer 150 by forming an uncured photosensitive polyimide (PSPI) layer 152 over exposed wire bond metal region 102 only, for example, by depositing PSPI and patterning to leave PSPI layer 152 only over wire bond metal region 102. PSPI layer 152 may include, for example, HD4000 series photosensitive polyimide materials from HD Microsystems, etc. However, other materials may also be used.

Referring to FIGS. 3A-B, a second embodiment of a method of forming a protective layer 250 over wire bond metal region 102 only is illustrated. In this embodiment, starting with structure 100 of FIG. 1, a protective layer 250 is formed prior to silicon oxide layer 108 and silicon nitride layer 106. In particular, as shown in FIG. 3A, protective layer 250 is formed as a barrier layer portion 252 over wire bond metal region 102 only, prior to forming silicon oxide layer 108 (FIG. 3B) and silicon nitride layer 106 (FIG. 3B). Barrier layer portion 252 may include, for example, silicon nitride, polysilicon, refractory metal film, or any other now known or later developed and appropriate barrier materials. This stage may include depositing a silicon nitride layer (not shown) and patterning to leave barrier layer portion 252 only over wire bond metal region 102.

As shown in FIG. 3B, silicon oxide layer ($SiO_2$) 108 and silicon nitride layer ($Si_3N_4$) 106 are next formed over barrier layer portion 252 over wire bond metal region 102 and over solder bond metal region 104. Silicon nitride layer 106 may have a thickness of, for example, approximately 0.4 μm, and silicon oxide layer 108 may have a thickness of, for example, approximately 0.45 μm. However, the invention is not limited to those dimensions. Polyimide layer 130 is then formed over silicon nitride layer 106 over solder bond metal region 102 and wire bond metal region 104. Layers 106, 108 and 130 may be formed using any now known or later developed techniques, e.g., deposition. FIG. 3B also shows forming first opening 132 exposing barrier layer portion 252 over wire bond metal region 102 through polyimide layer 130, silicon nitride layer 106 and silicon oxide layer 108, and a second opening 134 exposing solder bond metal region 104 through polyimide layer 130, silicon nitride layer 106 and silicon oxide layer 108. This stage may occur substantially similarly to that described above relative to FIG. 2A. That is, briefly, using photoresist 140 (in phantom) patterning and etching 144, e.g., using a wet develop/etch to remove polyimide layer 130, followed by a RIE to remove silicon nitride layer 106 and silicon oxide layer 108 over wire bond metal region 102 and solder bond metal region 104. Photoresist 140 is then removed using any now known or later developed stripping process.

Figure 4A:
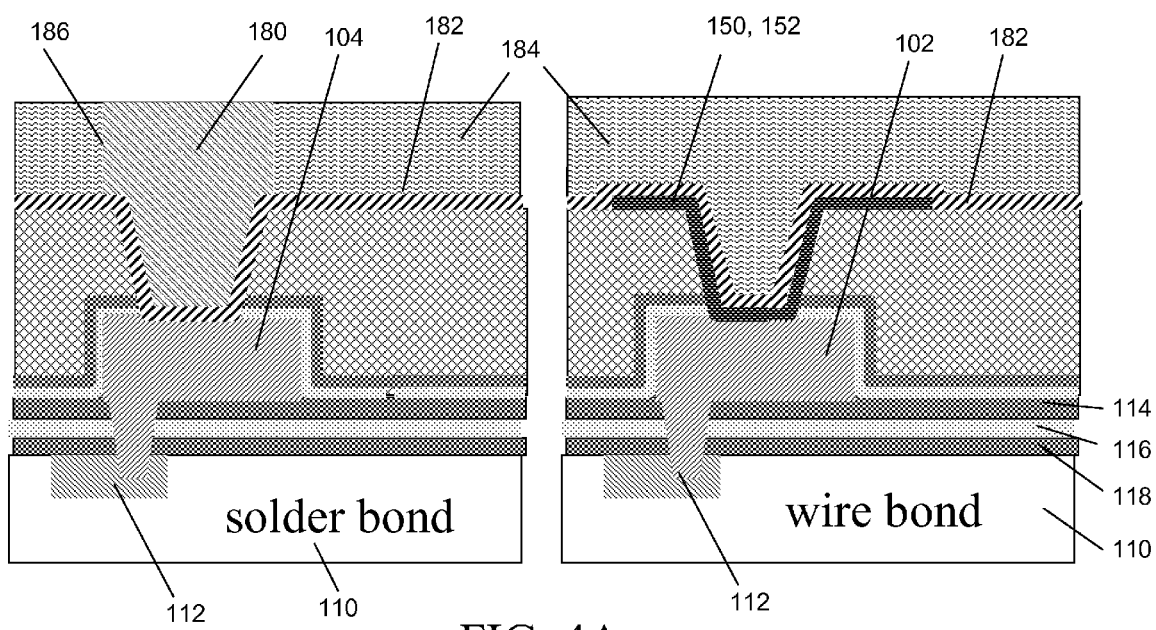
FIGS. 4A-B show another embodiment of forming the structure of FIGS. 2A-B, respectively.
Figure 4B:
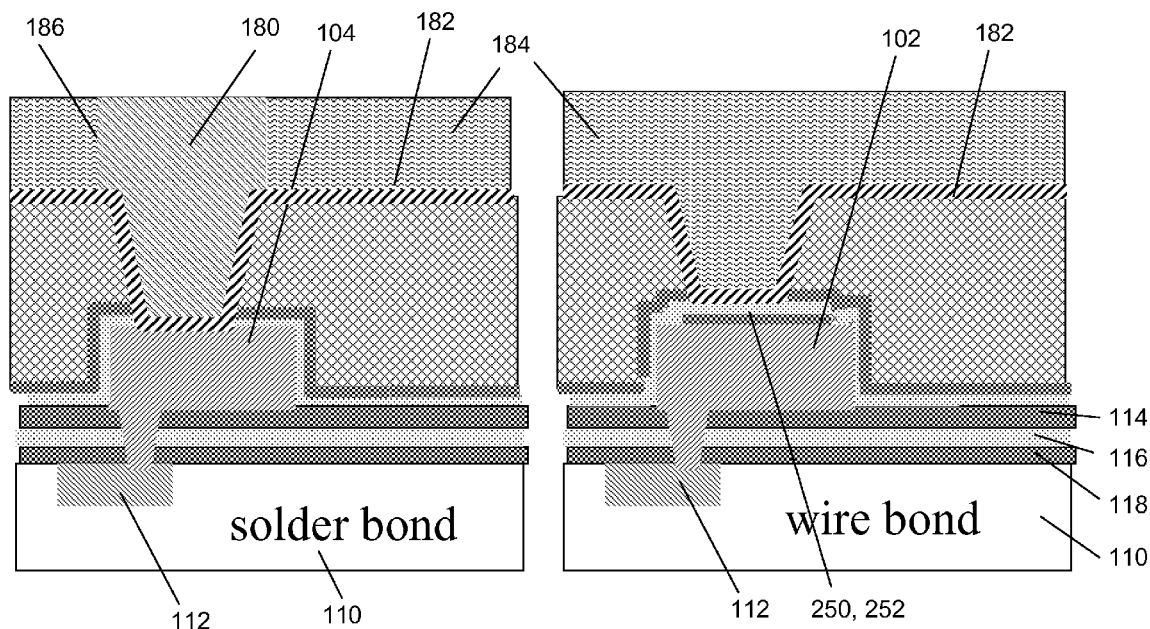

FIG. 4A shows forming solder bond 180 to solder bond metal region 104 while maintaining wire bond metal region 102 covered using the embodiment of FIGS. 2A-2B. FIG. 4B shows forming solder bond 180 to solder bond metal region 104 while maintaining wire bond metal region 102 covered using the embodiment of FIGS. 3A-B. In either case, this process may include depositing a ball limiting metallurgy (BLM) layer 182, e.g., by PVD. BLM layer 182 includes a solder wettable terminal metallurgy (e.g., tin (Sn) alloy), which defines the size and area of solder bond 180 when completed. BLM layer 182 limits the flow of the solder ball to the desired area, and provides adhesion and contact to the chip wiring. FIGS. 4A-B also show depositing a photoresist 184 and forming an opening 186 in photoresist 184 over solder bond metal region 104 only (i.e., no opening over wire bond metal region 102) to BLM layer 182. In one embodiment, photoresist 184 may include a photosensitive dry polymer resist such as RISTON® available from DuPont. However, other photoresist material may also be employed. Solder for solder bond 180 is formed (deposited) in photoresist opening 186. Solder bond 180 may include any now known or later developed solder materials, e.g., including typically any alloy of lead-tin (PbSn) or tin (Sn)(Pb-free). Wire bond metal region 102 remains covered during this entire process by photoresist 184 and the respective protective layers 150 (FIG. 4A) and 250 (FIG. 4B).

FIG. 5 shows exposing wire bond metal region 102 including removing protective layer 150 (FIG. 4A), 250 (FIG. 4B) to wire bond metal region 102. This process includes removing photoresist 184 (FIGS. 4A-4B) and BLM layer 182 (FIGS. 4A-B) except BLM layer 182S under solder bond 180 to expose wire bond metal region 102, e.g., by etching 192. If the FIG. 4A embodiment is used, this stage includes removing uncured PSPI layer 152 (FIG. 4A), e.g., using a dry etch 194, to expose wire bond metal region 102. If the FIG. 4B embodiment is used, this stage includes removing barrier layer portion 252, e.g., by RIE 194, to expose wire bond metal region 102.

As shown in FIG. 6, forming wire bond 190 to wire bond metal region 102 is next. This process may optionally include performing a wet clean 196 (FIG. 6) using, for example, hydrofluoric acid, of wire bond metal region 102 subsequent to protective layer 150, 250 (FIGS. 4A-B) removal. In addition, this process may include cleaning and reflowing solder bond 180. Wire bond 190 may then be formed to wire bond metal region 102 using any now known or later developed techniques.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming wire and solder bond structures, the method comprising:
    providing a structure including a wire bond metal region for the wire bond and a solder bond metal region for the solder bond;
    forming a protective layer over the wire bond metal region only;
    forming a silicon nitride layer over a silicon oxide layer over the wire bond metal region and the solder bond metal region;
    forming the solder bond to the solder bond metal region while maintaining the wire bond metal region covered;
    exposing the wire bond metal region including removing the protective layer; and
    forming the wire bond to the wire bond metal region.

2. The method of claim 1, wherein the protective layer forming occurs after the silicon oxide layer and the silicon nitride layer forming, and wherein the protective layer forming includes:
    forming a polyimide layer over the silicon nitride layer over the solder bond metal region and the wire bond metal region;
    forming a first opening exposing the wire bond metal region through the polyimide layer, the silicon nitride layer and the silicon oxide layer, and substantially simultaneously a second opening exposing the solder bond metal region through the polyimide layer, the silicon nitride layer and the silicon oxide layer; and
    forming the protective layer by forming an uncured photosensitive polyimide (PSPI) layer over the exposed wire bond metal region only.

3. The method of claim 2, wherein the wire bond exposing includes removing the uncured PSPI layer to expose the wire bond metal region.

4. The method of claim 3, further comprising:
    performing a wet clean of the wire bond metal region subsequent to the uncured PSPI layer removing; and
    cleaning and reflowing the solder bond.

5. The method of claim 1, wherein the protective layer forming occurs prior to the silicon oxide layer and the silicon nitride layer forming, and wherein the protective layer forming includes forming a barrier layer portion over the wire bond metal region only.

6. The method of claim 5, further comprising:
    forming a polyimide layer over the silicon nitride layer over the solder bond metal region and the wire bond metal region; and
    forming a first opening exposing the barrier layer portion over the wire bond metal region through the polyimide layer, the silicon nitride layer and the silicon oxide layer, and substantially simultaneously a second opening exposing the solder bond metal region through the polyimide layer, the silicon nitride layer and the silicon oxide layer.

7. The method of claim 6, wherein the wire bond exposing includes removing the barrier layer portion to expose the wire bond metal region.

8. The method of claim 7, further comprising:
    performing a wet clean of the wire bond metal region subsequent to the uncured PSPI layer removing; and
    cleaning and reflowing the solder bond.

9. The method of claim 1, wherein the solder bond forming includes:
    depositing a ball limiting metallurgy (BLM) layer;
    depositing a photoresist;
    forming an opening in the photoresist over the solder bond metal region only to the BLM layer;
    forming the solder bond in the photoresist opening; and
    removing the photoresist and the BLM layer except the BLM layer under the solder bond.

10. The method of claim 9, wherein the photoresist includes a photosensitive dry polymer resist.

11. The method of claim 1, wherein each of the solder bond and wire bond metal regions includes one of: aluminum and copper.

12. A method of forming wire and solder bond structures, the method comprising:

providing a structure including a wire bond metal region for the wire bond and a solder bond metal region for the solder bond;

forming a silicon nitride layer over a silicon oxide layer over the wire bond metal region and the solder bond metal region;

forming a protective layer over the wire bond metal region only by:

forming a polyimide layer over the silicon nitride layer over the solder bond metal region and the wire bond metal region, forming a first opening exposing the wire bond metal region through the polyimide layer, the silicon nitride layer and the silicon oxide layer, and substantially simultaneously a second opening exposing the solder bond metal region through the polyimide layer, the silicon nitride layer and the silicon oxide layer, and forming the protective layer by forming an uncured photosensitive polyimide (PSPI) layer over the exposed wire bond metal region only;

forming the solder bond to the solder bond metal region while maintaining the wire bond metal region covered;

removing the uncured PSPI layer to expose the wire bond metal region; and forming the wire bond to the wire bond metal region.

13. The method of claim 12, further comprising:

performing a wet clean of the wire bond metal region subsequent to the uncured PSPI layer removing; and cleaning and reflowing the solder bond.

14. The method of claim 12, wherein the solder bond forming includes:

depositing a ball limiting metallurgy (BLM) layer;

depositing a photoresist;

forming an opening in the photoresist over the solder bond metal region only to the BLM layer;

forming the solder bond in the photoresist opening; and removing the photoresist and the BLM layer except the BLM layer under the solder bond.

15. The method of claim 14, wherein the photoresist includes a photosensitive dry polymer resist.

16. The method of claim 12, wherein each of the solder bond and wire bond metal regions includes one of: aluminum and copper.

17. A method of forming wire and solder bond structures, the method comprising:

providing a structure including a wire bond metal region for the wire bond and a solder bond metal region for the solder bond;

forming a protective layer over the wire bond metal region only by forming a barrier layer portion over the wire bond metal region only;

forming a silicon nitride layer over a silicon oxide layer over the wire bond metal region and the solder bond metal region;

forming a polyimide layer over the silicon nitride layer over the solder bond metal region and the wire bond metal region;

forming a first opening exposing the barrier layer portion over the wire bond metal region through the polyimide layer, the silicon nitride layer and the silicon oxide layer, and substantially simultaneously a second opening exposing the solder bond metal region through the polyimide layer, the silicon nitride layer and the silicon oxide layer;

forming the solder bond to the solder bond metal region while maintaining the wire bond metal region covered;

exposing the wire bond metal region by removing the barrier layer portion; and forming the wire bond to the wire bond metal region.

18. The method of claim 17, further comprising:

performing a wet clean of the wire bond metal region subsequent to the barrier layer portion removing; and cleaning and reflowing the solder bond.

19. The method of claim 17, wherein the solder bond forming includes:

depositing a ball limiting metallurgy (BLM) layer;

depositing a photoresist;

forming an opening in the photoresist over the solder bond metal region only to the BLM layer;

forming the solder bond in the photoresist opening; and removing the photoresist and the BLM layer except the BLM layer under the solder bond.

20. The method of claim 17, wherein the photoresist includes a photosensitive dry polymer resist.

* * * * *